(12) United States Patent  (10) Patent No.: US 7,691,341 B2
Campbell et al.  (45) Date of Patent: Apr. 6, 2010

(54) METHOD OF FORMING A CATALYST ELEMENT HAVING A THERMAL BARRIER COATING AS THE CATALYST SUBSTRATE

(75) Inventors: Chris Campbell, Orlando, FL (US);
Andrew J. Burns, Orlando, FL (US);
Ramesh Subramanian, Oviedo, FL (US)

(73) Assignee: Siemens Energy, Inc., Orlando, FL (US)

( * ) Notice: Subject to any disclaimer, the term of this patent is extended or adjusted under 35 U.S.C. 154(b) by 142 days.

(21) Appl. No.: 12/099,280

(22) Filed: Apr. 8, 2008

(65) Prior Publication Data

US 2009/0048100 A1  Feb. 19, 2009

Related U.S. Application Data

(60) Division of application No. 10/158,372, filed on May 30, 2002, now Pat. No. 7,371,352, which is a continuation-in-part of application No. 09/963,283, filed on Sep. 26, 2001, now abandoned.

(51) Int. Cl.
*B01D 50/00* (2006.01)
*B32B 18/00* (2006.01)
(52) U.S. Cl. ........................................ 422/177; 428/335
(58) Field of Classification Search ................ 422/171, 422/177, 180, 190, 211, 222; 60/723, 777; 428/335, 472, 623
See application file for complete search history.

(56) References Cited

U.S. PATENT DOCUMENTS

| | | | |
|---|---|---|---|
| 4,086,082 A | 4/1978 | Mahalla | |
| 4,142,864 A | 3/1979 | Rosysky et al. | |
| 4,279,864 A | 7/1981 | Nara et al. | |
| 4,300,956 A | 11/1981 | Rosenberger et al. | |
| 4,340,505 A | 7/1982 | Dolan | |
| 4,343,074 A | 8/1982 | Bailey et al. | |
| 4,603,547 A | 8/1986 | Pfefferle et al. | |
| 4,711,009 A | 12/1987 | Cornelison et al. | |
| 4,870,824 A | 10/1989 | Young et al. | |
| 5,043,311 A | 8/1991 | Engler et al. | |
| 5,047,381 A | 9/1991 | Beebe | |
| 5,202,303 A | 4/1993 | Retallick et al. | |

(Continued)

OTHER PUBLICATIONS

Groppi, Gianpiero, et al. BaFexAI(12-x)O19 System for High-Temperature Cataylitc Combustion: Physico-Chemical Characterization and Catalytic Activity. Jourmal of Catalysis, vol. 168, 1977, pp. 95-103.

(Continued)

*Primary Examiner*—Tom Duong

(57) ABSTRACT

A combustion catalyst coating (36) applied to the surface of a ceramic thermal barrier coating (34) which is supported by a metal substrate (32). The microstructure of the thermal barrier coating surface provides the necessary turbulent flow and surface area for interaction of the catalyst and a fuel-air mixture in a catalytic combustor of a gas turbine engine. The temperature gradient developed across the thermal barrier coating protects the underlying metal substrate from a high temperature combustion process occurring at the catalyst surface. The thermal barrier coating deposition process may be controlled to form a microstructure having at least one feature suitable to interdict a flow of fuel-air mixture and cause the flow to become more turbulent than if such feature did not exist.

11 Claims, 3 Drawing Sheets

U.S. PATENT DOCUMENTS

| | | |
|---|---|---|
| 5,293,743 A | 3/1994 | Usleman et al. |
| 5,305,726 A | 4/1994 | Scharman et al. |
| 5,318,757 A | 6/1994 | Abe et al. |
| 5,440,872 A | 8/1995 | Pfefferle |
| 5,518,697 A | 5/1996 | Dalla Betta et al. |
| 5,551,239 A | 9/1996 | Feeley et al. |
| 5,555,621 A | 9/1996 | Tanabe et al. |
| 5,562,998 A | 10/1996 | Strangman |
| 5,609,563 A | 3/1997 | Suzuki et al. |
| 5,612,277 A | 3/1997 | Haerkoenen et al. |
| 5,787,584 A | 8/1998 | Shea et al. |
| 5,826,429 A | 10/1998 | Beebe et al. |
| 5,840,434 A | 11/1998 | Kojima et al. |
| 5,866,079 A | 2/1999 | Machida et al. |
| 5,985,220 A | 11/1999 | Hughes |
| 6,006,516 A | 12/1999 | Voss et al. |
| 6,077,483 A | 6/2000 | Locker et al. |
| 6,086,829 A | 7/2000 | Shea et al. |
| 6,099,809 A | 8/2000 | Foster et al. |
| 6,162,530 A | 12/2000 | Xiao et al. |
| 6,203,927 B1 | 3/2001 | Subramanian et al. |
| 6,210,791 B1 | 4/2001 | Skoog et al. |
| 6,272,863 B1 | 8/2001 | Pfefferle et al. |
| 6,294,260 B1 | 9/2001 | Subramanian |
| 6,358,879 B1 | 3/2002 | Pfefferle et al. |
| 6,559,094 B1 | 5/2003 | Korotkikh et al. |
| 6,586,115 B2 | 7/2003 | Rigney et al. |
| 6,620,525 B1 | 9/2003 | Rigney et al. |

OTHER PUBLICATIONS

Inoue, Hiroshi, et al. Thermal Stability of Hexaaluminate Film Coated on SiC Substrate for High-Temperature Catalytic Application. Journal, American Ceramic Society, vol. 80, No. 3, 1977, pp. 584-588.

Nair, Jalajakumari, et al. Sintering of Lanthanum Zirconate. Journal, American Ceramic Society,, vol. 82, No. 8, 1999, pp. 2066-2072.

Seiyama, T. Total Oxidation of Hydrocarbons on Perovskite Oxides. Catal. Rev.-Sci. Eng., vol. 34, No. 4, 1992, pp. 281-300.

Sekizawa, Koshi, et al. Catalytic Properties of Pd-Supported Hexaaluminate Catalysts for High-Temperature Catalytic Combustion. Journal of Catalysis, vol. 142, 1993, pp. 655-663.

US 7,691,341 B2

METHOD OF FORMING A CATALYST ELEMENT HAVING A THERMAL BARRIER COATING AS THE CATALYST SUBSTRATE

CROSS REFERENCE TO RELATED APPLICATIONS

This is a divisional application of U.S. patent application Ser. No. 10/158,372, now U.S. Pat. No. 7,371,352 filed May 30, 2002, which is a continuation-in-part of U.S. patent application Ser. No. 09/963,283 filed Sep. 26, 2001 now abandoned.

FIELD OF THE INVENTION

This invention relates generally to the field of gas turbines, and more specifically to a gas turbine including a catalytic combustor, and in particular to a catalytic reactor having improved high temperature operating characteristics.

BACKGROUND OF THE INVENTION

In the operation of a conventional gas turbine, intake air from the atmosphere is compressed and heated by a compressor and is caused to flow to a combustor, where fuel is mixed with the compressed air and the mixture is ignited and burned. The heat energy thus released then flows in the combustion gasses to the turbine where it is converted into rotary mechanical energy for driving equipment, such as for generating electrical power or for running an industrial process. The combustion gasses are then exhausted from the turbine back into the atmosphere. These gases include pollutants such as oxides of nitrogen, carbon monoxide and unburned hydrocarbons. Various schemes have been used to minimize the generation of such pollutants during the combustion process. The use of a combustion catalyst in the combustion zone is known to reduce the generation of these pollutants since catalyst-aided combustion promotes complete combustion of lean premixed fuels and can occur at temperatures well below the temperatures necessary for the production of NOx species. Typical catalysts for a hydrocarbon fuel-oxygen reaction include platinum, palladium, rhodium, iridium, terbium-cerium-thorium, ruthenium, osmium and oxides of chromium, iron, cobalt, lanthanum, nickel, magnesium and copper.

FIG. 1 illustrates a prior art gas turbine combustor 10 wherein at least a portion of the combustion takes place in a catalytic reactor 12. Such a combustor 10 is known to form a part of a combustion turbine apparatus such as may be used to power an electrical generator or a manufacturing process. Compressed air 14 from a compressor (not shown) is mixed with a combustible fuel 16 by a fuel-air mixing device such as fuel injectors 18 at a location upstream of the catalytic reactor 12. Catalytic materials present on surfaces of the catalytic reactor 12 react the fuel-air mixture at temperatures lower than normal ignition temperatures. Known catalyst materials are not active at the compressor discharge supply temperature for certain fuels and engine designs, such as natural gas lean combustion. Accordingly, a preheat burner 20 is provided to preheat the combustion air 14 by combusting a supply of preheat fuel 22 upstream of the main fuel injectors 18. Existing catalytic combustor designs react approximately 10-15% of the fuel on the catalyst surface, with the remaining combustion occurring downstream in the burnout region 24. Increasing the percentage of the combustion on the catalyst surface will decrease the amount of combustion occurring in the flame, thus decreasing the overall emission of oxides of nitrogen. However, increasing the amount of combustion on the catalyst surface will also increase the temperature of both the catalyst and the catalyst substrate. One of the limitations to increasing the amount of combustion in the catalytic reactor 12 is the operating temperature limit of the underlying metal substrate material.

The operating environment of a gas turbine is very hostile to catalytic reactor materials, and is becoming even more hostile as the demand for increased efficiency continues to drive firing temperatures upward. Ceramic substrates used for catalytic reactor beds are prone to failure due to thermal and mechanical shock damage. Furthermore, ceramic substrates are difficult to fabricate into complex shapes that may be desired for catalyst elements. Metal substrates have been used with some success with current generation precious metal catalysts at temperatures up to about 800° C. Such catalytic reactors are produced by applying a ceramic wash-coat and catalyst directly to the surface of a high temperature metal alloy. In one embodiment, the catalytic reactor 12 of FIG. 1 is formed as a plurality of metal tubes. The outside surfaces of the tubes are coated with a ceramic wash-coat and a platinum catalyst. The fuel-air mixture is combusted at the catalyst surface, thereby heating the metal substrate. The substrate is cooled by passing an uncombusted fuel-air mixture through the inside of the tube. Other geometries of back-cooled metal substrate catalyst modules may be envisioned, such as the catalytic combustor described in U.S. Pat. No. 4,870,824 dated Oct. 3, 1989.

U.S. Pat. No. 5,047,381 dated Sep. 10, 1991, describes a laminated substrate for a catalytic combustor reactor bed including a metal alloy substrate coated with a noble metal, such as platinum, upon which a ceramic wash-coat such as alumina is applied. A catalyst is applied with the wash-coat or individually over the wash-coat. The noble metal coating prevents oxygen from contacting the metal substrate, thereby minimizing its degradation by oxidation reactions. The underlying noble metal also acts as a catalyst in the event that a portion of the ceramic wash-coat erodes or is otherwise removed from the substrate. While the reduced rate of oxidation will extend the life of the reactor bed in a combustor at any given temperature, such a design does not offer any significant thermal protection for the substrate. Work is underway to develop catalysts operable at higher combustion temperatures. As the allowable working temperature of the catalyst increases, the task of cooling the metal substrate supporting the catalyst will become increasingly difficult.

SUMMARY OF THE INVENTION

Accordingly, there is a need for an improved catalytic element for use in a gas turbine combustor that is capable of operating at temperatures higher than the limits existing for current designs.

A catalyst element is described herein as including: a substrate; a thermal barrier coating disposed over the substrate having a specific surface area of less than about 18 m$^2$/g; and a combustion catalyst disposed over the thermal barrier coating. A ceramic wash-coat may be disposed between the thermal barrier coating and the catalyst. In order to obtain a desired more turbulent flow of fuel-air mixture, the thermal barrier coating surface has at least one feature suitable to interdict the flow and cause the flow to become more turbulent than if such feature did not exist.

A method of forming a catalyst element is described herein as including: providing a substrate; depositing a ceramic thermal barrier coating material over the substrate having a specific surface area of less than about 30 m$^2$/g; and depositing a combustion catalyst material over the ceramic thermal barrier coating material. A ceramic wash-coat may be deposited over ceramic thermal barrier coating material prior to the step of depositing a combustion catalyst material. In order to obtain a desired turbulent flow, the ceramic thermal barrier coating material may be deposited by a plasma spray process modified to form at least one surface feature suitable to interdict the fuel-air mixture flow and cause the flow to become more turbulent than if such feature did not exist.

BRIEF DESCRIPTION OF THE DRAWINGS

The invention described herein may best be understood by referring to the following drawings in which.

DETAILED DESCRIPTION OF THE INVENTION

Figure 1:
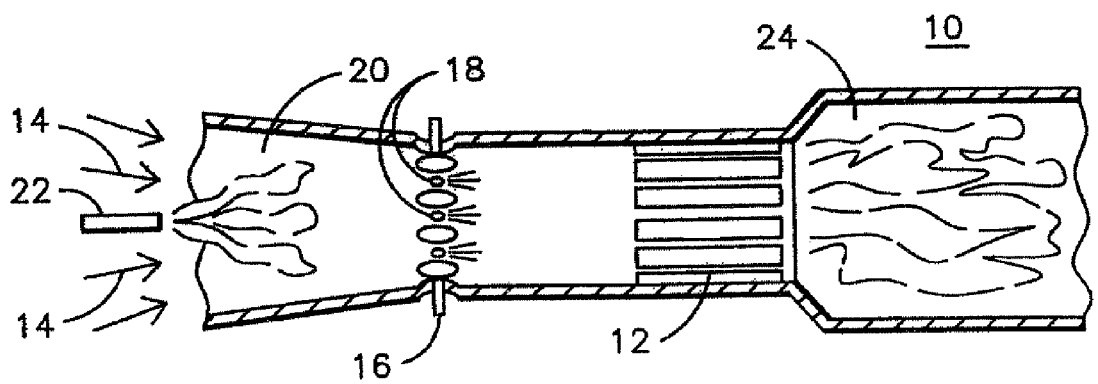
FIG. 1 is a partial side-sectional view of a catalytic combustor for a gas turbine.
Figure 2:
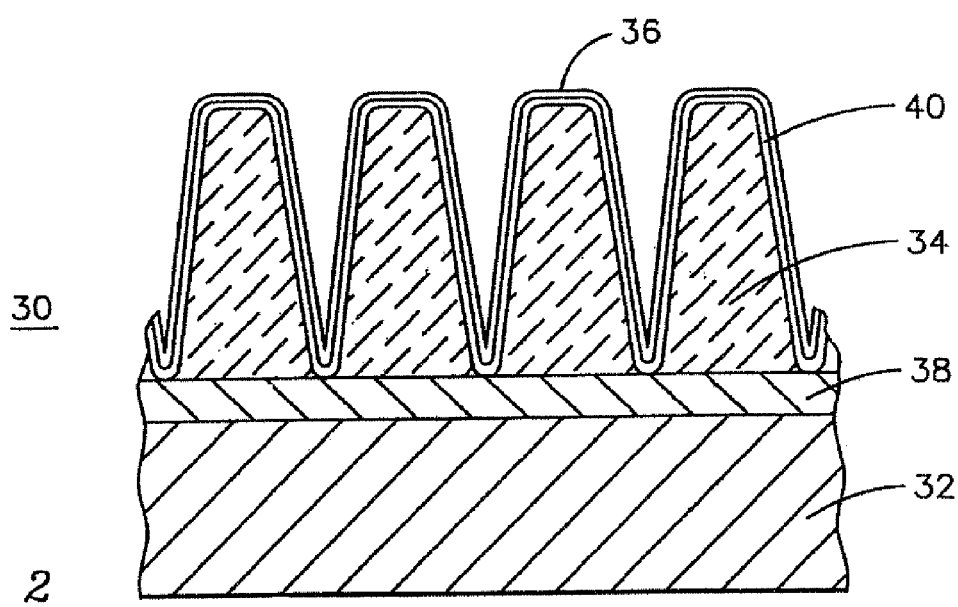
FIG. 2 is a partial cross-sectional view of a tube portion of a catalytic reactor as may be used in the combustor of FIG. 1.

The application of a catalytic material to a ceramic thermal barrier coating on a metal substrate is illustrated in FIG. 2 and described below. FIG. 2 is a partial cross-sectional view of a catalyst element 30 including a metal alloy substrate formed as a thin-walled tube 32. While the tube construction is described herein, one skilled in the art may appreciate that other configurations may be most appropriate for certain applications. Such other configurations may include a flat plate, a foil, or a corrugated structure, for example. The material of construction of the substrate is preferably a high temperature alloy, and may be, for example, steel or a nickel or cobalt based superalloy material. The substrate may be formed to have any desired thickness and shape, for example a thin sheet, and in one embodiment is a $\frac{3}{16}$-inch diameter, 0.010-inch thick tube.

A layer of a ceramic thermal barrier coating material 34 is applied over the substrate on the outside surface of the tube 32, and a catalytic material 36 is exposed at the surface of the thermal barrier coating 34. A substrate for a catalyst should exhibit a large surface area for maximizing the contact between the catalyst and the fuel-air mixture passing over the substrate surface. Typical ceramic wash-coats used as catalyst substrates possess a specific surface area (SSA) of approximately 18-30 m²/g. In order to maximize its exposed surface area, thermal barrier coating material 34 may be deposited onto the metal tube 32 by electron beam physical vapor deposition (EB-PVD) in order to produce a columnar-grained microstructure having a plurality of closely spaced columns of material, as illustrated in FIG. 2. The deposition process parameters may be controlled to optimize the resulting surface area. The columnar grained structure is known in the art to provide a significant amount of open porosity on the exposed surface of the thermal barrier coating. An idealized EB-TBC columnar-grained thermal barrier coating structure may have an SSA of between 50-150 m²/g, assuming that the structure has columns of approximately 10 microns diameter and 10 microns height covered with much smaller cones of material of approximately 1 micron diameter and 1 micron height. Although the actual SSA of an TBC coating deposited by EB-PVD has not been empirically measured by the present inventors, it is assumed that the actual usable specific surface area of an EB-TBC coating would be at least approximately the same magnitude as that of a ceramic wash coat substrate because the idealized surface area is so large. The deposition process can be controlled so that the SSA of the surface is at least 18 m²/g, or in the range of 18-30 m²/g.

The thermal barrier coating 34 may be any of the conventional ceramic compositions used for insulating a metal substrate from a high temperature environment, for example the widely used yttrium-stabilized zirconia (YSZ). The thermal barrier coating 34 may be deposited onto the tube 32 to any desired thickness, in one embodiment to a thickness of about 0.020-inches. A bond coat 38 may be used between the substrate 32 and the thermal barrier coating 34. Common bond coat materials 38 include MCrAlY, where M denotes nickel, cobalt, iron or mixtures thereof, as well as platinum aluminide and platinum enriched MCrAlY. Techniques for applying ceramic thermal barrier coatings over high temperature metal alloys for use in the environment of a gas turbine combustor are well known in the art, so the catalytic element 30 of FIG. 2 is expected to exhibit long life in this application without early mechanical failure. While EB-PVD coating processes are generally considered to be expensive, it is possible to coat a large number of tubes or other substrate forms simultaneously, thereby reducing the per-unit cost of the process. Furthermore, less expensive plasma or thermal spray coating processes, chemical vapor deposition processes, EB-DVD or ESAVD processes may be developed for producing a similar columnar-grained structure or alternative high-SSA surface.

Efforts are underway within the field of the invention to develop catalyst materials that may be operated at increasingly higher temperatures. For example, Ba—Al—O systems, Ga—Fe—O systems and La—Al—O systems may have the potential for operation at temperatures well in excess of precious metal catalysts. A material may function as both a thermal barrier coating material and as a combustion catalyst. Thus a TBC protecting a metal substrate may support combustion at its exposed surface. Such materials include:

pyrochlores with the formula $A_2B_2O_7$ or $AB_2O_6$ where A is selected from the rare earth elements and B is selected from the group of zirconium, hafnium, titanium, niobium and tantalum (for example, $La_2Hf_2O_7$ and $Sm_2Zr_2O_7$);

perovskites with the formula $ABO_3$ where A is selected from the group of rare earth elements, alkaline earth elements and manganese, and B is selected from the group of aluminum, chrome, tungsten, zirconium, hafnium, titanium, niobium, tantalum, iron, manganese, cobalt, nickel and chrome;

garnets with the formula $A_3Al_5O_{12}$ where A is selected from the group of rare earth elements;

the hexaluminates $LaAl_{11}O_{18}$, $BaMnAl_{11}O_{18}$, $BaAl_{12}O_{19}$, and $BaMAl_{11}O_{19}$ where M is selected from the group of chrome, manganese, iron, cobalt and nickel; and spinels with the formula $AB_2O_4$ where A is selected from the group of alkaline earth elements and B is selected from the group of aluminum, iron, manganese, cobalt, chrome and nickel.

It is known to apply a sintering resistant material within the sub-micron sized gaps between adjacent columns of a columnar-grained structure, as described in U.S. Pat. No. 6,203,927 B1 issued on Mar. 20, 2001, A high temperature catalyst material may similarly be applied within such gaps. The catalyst may be deposited using any known process, such as a sol gel, plasma spray or CVD process. If additional surface area is desired for depositing the catalyst material 36, a ceramic wash coat 40 may be applied to the thermal barrier coating layer 34 before applying the catalytic material 36.

Figure 3:
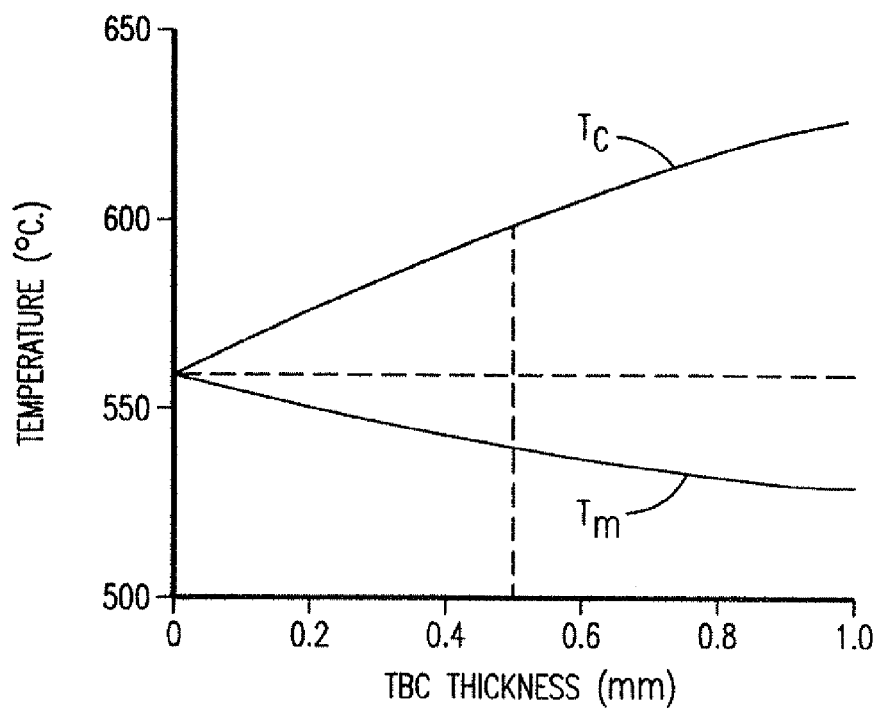
FIG. 3 is a graph of catalyst and metal temperatures verses thickness of thermal barrier coating for the device of FIG. 2 at a lower temperature.
Figure 4:
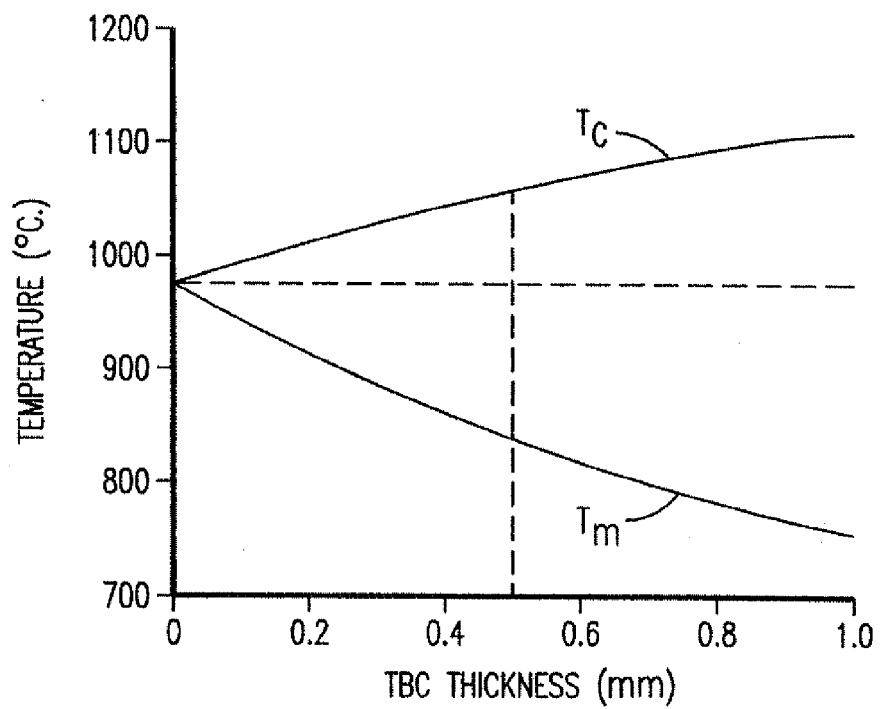
FIG. 4 is a graph of catalyst and metal temperatures verses thickness of thermal barrier coating for the device of FIG. 2 at a higher temperature.

Heat transfer analyses were performed to determine the potential benefit of the tube catalyst structure illustrated in FIG. 2. The structure modeled was a 0.010 inch (0.254 mm) thick tube 32 having a $k_{metal}$=23 W/mK. The thickness of thermal barrier coating was varied from zero to one millimeter, and has a value of $k_{TBC}$=1.1 W/mK at a thickness of 0.5 mm (0.0197 inch) thick. Analyses were performed for both a relatively lower temperature (790° C.) and a relatively higher temperature (1,300° C.) combustion gas temperatures. The heat transfer coefficient of the coolant passing through the tube 32 was assumed to be 1228 W/m$^2$K, while the heat transfer coefficient of the combustion gas was assumed to be 629 W/m$^2$K for the lower temperature case and 2,000 W/m$^2$K for the higher temperature case. FIGS. 3 and 4 illustrate the benefit derived from the use of the thermal barrier coating 34, with FIG. 3 being the lower temperature case and FIG. 4 being the higher temperature case. The temperature of the catalyst $T_C$ and the temperature of the metal $T_M$ are both illustrated. As can be seen from the figures, as the thickness of the thermal barrier coating 34 increases, the catalyst temperature increases and the metal temperature decreases. An increased catalyst temperature should increase the activity of the catalyst, and a decrease in the metal temperature should improve the life of the metal. A higher catalyst temperature with a lower metal temperature will allow designers to increase the amount of combustion occurring within a catalytic reactor and to decrease the amount of combustion occurring in a downstream flame, thereby reducing the overall emissions of a combustor. The presence of the thermal barrier coating 34 may also protect the metal tube 32 from transient conditions that dramatically increase the combustion temperature for short periods of time.

For the lower temperature case of FIG. 3, the metal tube is not being driven to its maximum capability due to the large temperature gradient across the thickness of the thermal barrier coating 34, so the benefit of the thermal barrier coating 34 is somewhat limited. Nonetheless, for a thermal barrier coating having a thickness of 0.5 mm, the catalyst temperature is increased by 37° C. and the metal temperature is decreased by 19° C., as indicated by the dashed lines on the figure.

For the higher temperature case of FIG. 4, this same thickness of thermal barrier coating 34 results in an increase in catalyst temperature of 83° C. and a decrease in metal temperature of 137° C. This lower metal temperature would be expected to dramatically increase the life of the metal substrate 32. This higher catalyst temperature may allow for the use of higher temperature catalytic materials such as high temperature hexaaluminate-based catalytic ceramics. Furthermore, the same TBC-coated tube design could be used as both a low temperature (600-900° C.) and a medium temperature (900-1,300° C.) catalytic substrate.

Figure 5:
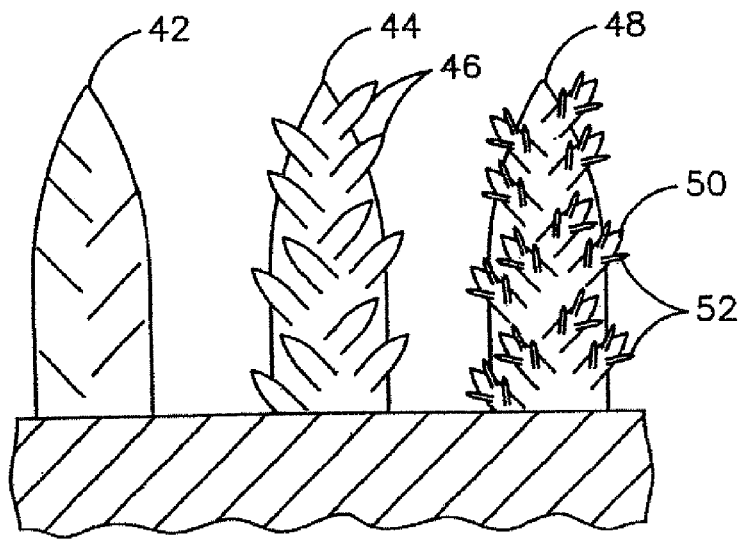
FIG. 5 is an illustration of a columnar-grained thermal barrier coating material having primary columns as well as secondary and tertiary branches from primary columns.

In order to improve the effectiveness of the catalyst, one may purposefully control the thermal barrier coating deposition process so that the specific surface area is maximized or at least so that a desired SSA is achieved. FIG. 5 illustrates three different conditions of column growth that may be achieved when depositing a thermal barrier coating by a PVD process. Column 42 illustrates a single primary column of TBC material as may be formed by epitaxial growth of a single crystal. Column 44 is a primary column that supports a plurality of secondary branches 46. Column 48 is a primary column supporting secondary branches 50 which in turn each support a plurality of tertiary branches 52. One may appreciate that such individual columns 42, 44, 48 would not be expected to grow apart from other such columns, nor would these three types of columns necessarily be expected to be grown side by side during the same deposition process, however, they are shown together here for purposes of illustration and comparison. Column 48 is the least-epitaxial of these three columns and it represents the most random growth pattern of the three columns. With other variables being equal, one would expect that the specific surface area of column 42 to be the lowest of the three and that of column 48 to be the highest of the three. An EB-PVD process used to deposit a TBC material may be driven toward the more random structure of column 48 with secondary and tertiary branching by controlling the deposition parameters. An increased feed rate, a lower temperature, a slower substrate rotation rate, and/or a higher chamber pressure will drive the deposition process toward more random conditions and will support the development of secondary 46 and tertiary 52 crystalline branches.

Figure 6:
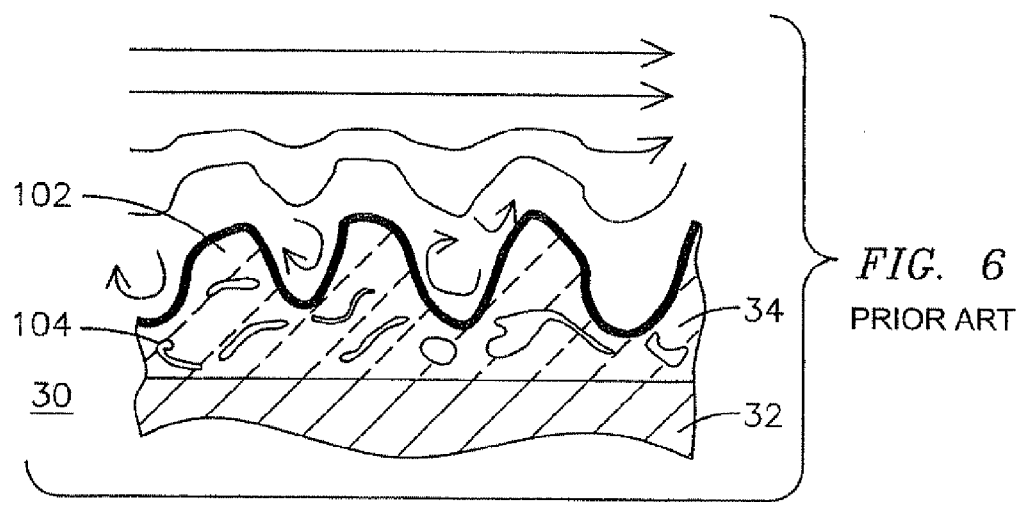
FIG. 6 is an illustration of a conventional plasma sprayed thermal barrier coating material having a generally flat-wavy grain microstructure with discrete closed internal pores that extend generally parallel to the top surface of the substrate.
Figure 7:
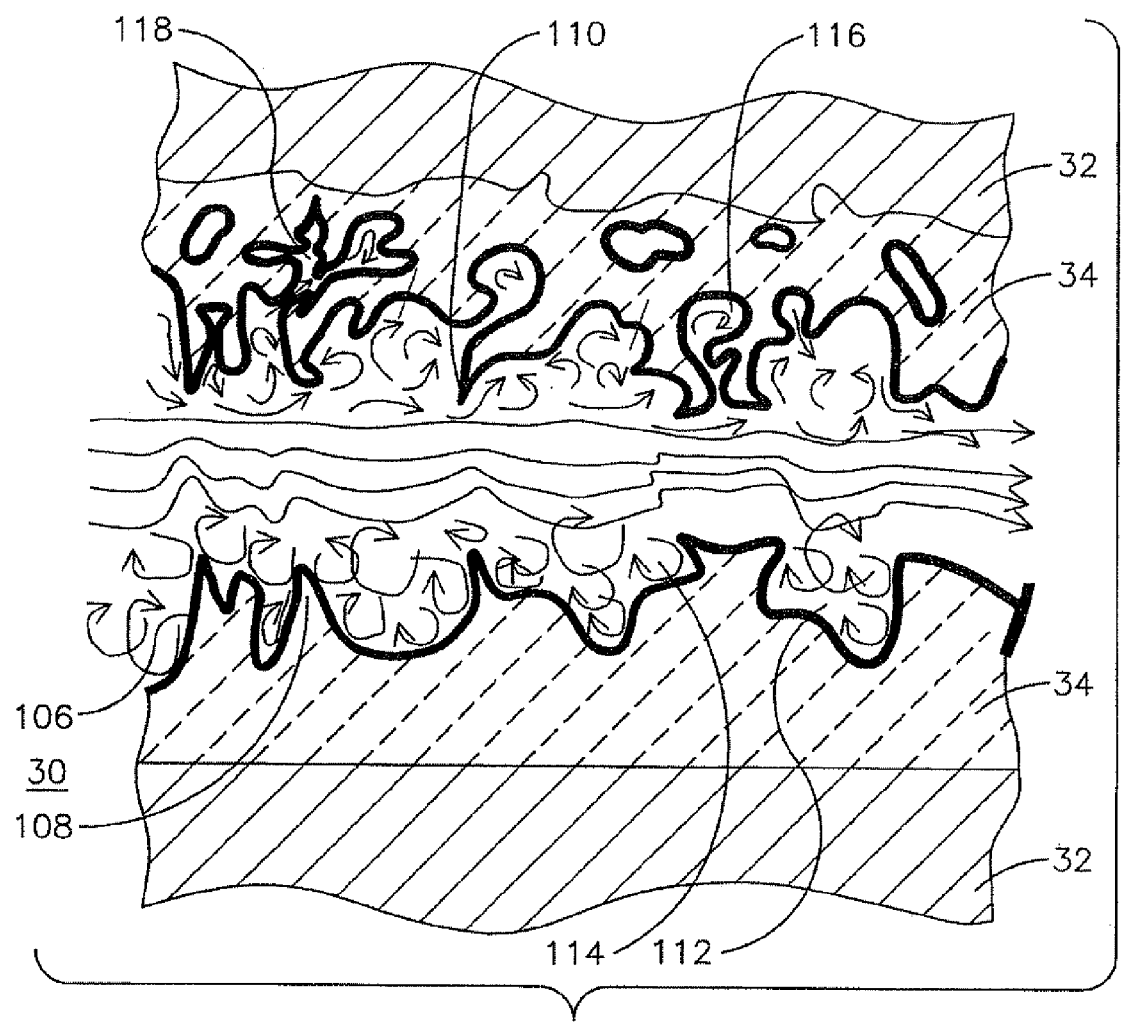
FIG. 7 is an illustration of a modified plasma sprayed thermal barrier coating material having a microstructure with at least one surface feature suitable to interdict the fuel-air mixture flow and cause the flow to become more turbulent than if such feature did not exist.

In accordance with the another concept of the present invention, and referring now to FIGS. 6 and 7, the catalyst element 30 comprises a thermal barrier coating 34 having a modified turbulent-flow inducing surface. Like with the above-described concepts and embodiments, the thermal barrier coating 34 is disposed over a substrate 32 and a catalytic material 36 is disposed over or is at an exposed surface of the thermal barrier coating 34. The optional bond coat and wash coat (not shown) can also be used. Thus, the above description of like components, materials and methods should be understood as applying equally to the below embodiments, unless stated otherwise.

It has been found that although typical catalyst substrates possess a SSA of approximately 18-30 m$^2$/g to provide a suitably large surface area for sufficient contact between the catalyst and the fuel-air mixture and that thermal barrier coatings should therefore advantageously comprise a generally similar or greater SSA, this generally accepted SSA range can be lowered to less than 18 m$^2$/g and even to significantly less than 18 m$^2$/g such as 0.018 m$^2$/g or even 0.0018 m$^2$/g or lower by adapting the thermal barrier coating 34 surface to cause a more turbulent flow of fuel-air mixture. This more turbulent flow allows for an increased amount of catalytic reactions to take place per surface area per unit flow on the catalytic material 36. By increasing fuel-air mixture flow turbulence, there is an increase in the amount of combusted fuel-air mixture directed away from the catalytic material 36 as well as an increase in the amount of uncombusted fuel-air mixture directed toward the catalytic material 36. Although this concept of the present invention is described in context of adapting the thermal barrier coating 34 to provide such more turbulent flow to the fuel-air mixture, it will be understood that the catalyst material 36 itself or other surface such as the bond coat or another (e.g. bilayer) thermal barrier coating comprising the same or different composition such as stabilized zirconia or a ternary oxide having a pyrochlore or perovskite structure could be similarly adapted to provide or help provide such more turbulent flow.

Referring to FIG. 6, a conventional plasma sprayed thermal barrier coating 34 is shown. The coating 34 is characterized by a generally flat-wavy 102 grain microstructure of molten splats with discrete closed internal cracks or pores 104 that extend generally parallel to the top surface of the substrate 32, as taught for example in U.S. Pat. No. 6,294,260 which is herein incorporated by reference in its entirety. The fuel-air mixture cannot flow through this microstructure, unlike the PVD microstructure where the fuel-air mixture can flow within and throughout the columns (the fuel-air mixture flow pattern being show by the arrowed lines). This plasma sprayed microstructure has a relatively low SSA of less than about 18 $m^2/g$, preferably about 0.0018 $m^2$ μg to about 18 $m^2/g$, and more preferably about 0.018 $m^2/g$ to about 0.18 $m^2/g$. This plasma sprayed microstructure also supports a fuel-air mixture flow that is partly laminar and partly turbulent, typically predominately laminar with a small turbulent portion near the flat-wavy surface 102, and having a relatively small Reynold's Number when compared to a PVD microstructure.

Referring to FIG. 7, a modified plasma sprayed thermal barrier coating 34 is shown. The thermal barrier coating 34 has a SSA of approximately 1-18 $m^2/g$, however, this SSA could be more (e.g. preferably about 18-30 $m^2/g$) or less according to the teachings of this invention. The thermal barrier coating 34 has a surface adapted to cause a more turbulent boundary size layer or flow of fuel-air mixture than conventional plasma sprayed thermal barrier coatings 34, and preferably is adapted to cause turbulent flow throughout at least one-fifth of the fuel-air mixture, and more preferably is adapted to cause turbulent throughout about one-third of the fuel-air mixture, and most preferably is adapted to cause turbulent throughout the majority or even substantially all of the fuel-air mixture. Opposing wall boundaries or portions of thermal barrier coating 34 can cooperate to cause the desired turbulent flow, and the geometrical spacing and configuration between the thermal barrier coatings 34 can also be modified to limit or alter the amount of fuel-air mixture that is combusted.

The thermal barrier coating 34 surface is applied such that it advantageously comprises obstacles, structures or features that, when arranged to interdict the flow of the fuel-air mixture, causes the flow to become more turbulent than if such obstacles or features did not interdict the flow. Some exemplary surface conditions that may be achieved when depositing a thermal barrier coating 34 by the modified plasma spray process is shown. For example, molten splats forming a jagged surface portion 106 can be seen. Other features that may be formed include peaks 108, spikes 110, canyons 112, bowls 114, craters 116, tunnels 118 and the like. As will be understood by one skilled in the art, a wide variety of other features suitable to interdict the flow of the fuel-air mixture and cause the flow to become more turbulent than if such feature did not exist can be used. One may appreciate that such features may or may not be expected to form near each other or near other similar features during the same deposition process, however, they are shown together here for purposes of illustration and comparison.

A plasma spray process used to deposit a thermal barrier coating 34 may be driven toward the more dense development of features by controlling the deposition parameters. An increased or varied feed rate, a larger or varied particle size, a lower or varied spray temperature, a lower or varied stand-off distance, a higher or varied spray velocity, a slower or varied substrate rotation rate, a lower or varied spray angle, a change or variation in the substrate rotation rate relative to the spray gun vertical traverse rate, an interdiction of outside gasses or gas flows, a roughening or altering of the underlying substrate, and/or a spraying of fugitive materials or foreign objects with or in addition to the thermal barrier coating 34 will tend to drive the deposition process toward more random conditions and will support the development of more features. One skilled in the art will readily appreciate that the modification of one or more of the above-identified or other parameters, and the extent to which the one or more parameters are modified, can be used or mixed and matched to provide any number of modified thermal spray deposition processes suitable to form at least one feature, preferably a plurality of features, of the present invention.

For example, use of a stand-off distance of 55+/−30 cm at spray conditions of gun power of 60+/−20 volts, gun angle of 0-30°, primary gas flow of 85+/−30 $ft^3$/hr, particle feed rate of 50+/−20 g/min, step size or pitch rate of 7+/−5 mm, and optionally varying these quantities during the spray process within the +/− amounts should support the development of desired features.

Another way to obtain a thermal barrier coating 34 surface comprising features adapted to cause a more turbulent airflow is by modifying the conventional PVD deposition process, as previously described.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

We claim as our invention:

1. A method of forming a catalyst element, the method comprising:
   providing a substrate having a surface;
   depositing a plasma sprayed ceramic thermal barrier coating material over the substrate having a specific surface area of less than about 18 $m^2/g$ effective to provide an increased amount of catalic reactions per surface area of the coating per unit flow on the catalic element; and
   depositing a combustion catalyst material over the ceramic thermal barrier coating material.

2. The method of claim 1, farther comprising depositing a ceramic wash-coat over ceramic Thermal barrier coating material prior to the step of depositing a combustion catalyst material.

3. The method of claim 1, further comprising depositing the ceramic thermal barrier coating by a plasma spray process.

4. The method of claim 3, further comprising controlling deposition parameters during the plasma spray deposition process to support the development of features suitable to interdict a flow of fuel-air mixture and cause the flow to become more turbulent than if such feature did not exist.

5. The method of claim 4, wherein the step of controlling deposition parameters comprises controlling at least one of a feed rate, a particle size, a temperature, a rotation rate, and a spray angle.

6. The method of claim 1, wherein the substrate is a formed as a sheet or a tube.

7. The method of claim 1, wherein the substrate is formed substantially flat or corrugated.

8. A method of forming a catalyst element, the method comprising:

providing a metal substrate having a surface; and depositing a plasma sprayed thermal barrier coating material over the metal substrate having a specific surface area of less than about 18 $m^2/g$ effective to function as a catalytic material at an exposed surface of the thermal barrier coating and provide an increased amount of catalytic reactions per surface area of the coating per unit flow on the catalytic element.

9. The method of claim 8, further comprising depositing a combustion catalyst material over the thermal barrier coating material.

10. The method of claim 8, wherein the catalytic material comprises one of the group of:

pyrochlores with the formula $A_2B_2O_7$ or $AB_2O_6$ where A is selected from the rare earth elements and B is selected from the group of zirconium, hathium, titanium, niobium and tantalum;

perovskites with the formula $ABO_3$ where A is selected from the group of rare earth elements, alkaline earth elements and manganese, and B is selected from the group of aluminum, chrome, tungsten, zirconium, hafnium, titanium, niobium, tantalum, iron, manganese, cobalt, nickel and chrome;

garnets with the formula $A_3Al_5O_{12}$ where A is selected from the group of rare earth elements;

the hexaluminates $LaAl_{11}O_{18}$, $BaMnAl_{11}O_{18}$, $BaAl_{12}O_{19}$, and $BaMAl_{11}O_{19}$ where M is selected from the group of chrome, manganese, iron, cobalt and nickel; and spinels with the formula $AB_2O_4$ where A is selected from the group of alkaline earth elements and B is selected from the group of aluminum, iron, manganese, cobalt, chrome and nickel.

11. The method of claim 8, wherein the catalytic material comprises a pyrochlore with the formula $A_2B_2O_7$ or $AB_2O_6$ where A is selected from the rare earth elements and B is selected from the group of zirconium, hafnium, titanium, niobium and tantalum.

* * * * *